(12) United States Patent
Abdollahi-Alibeik et al.

(10) Patent No.: US 6,819,278 B1
(45) Date of Patent: Nov. 16, 2004

(54) GEOMETRIC D/A CONVERTER FOR A DELAY-LOCKED LOOP

(75) Inventors: Shahram Abdollahi-Alibeik, Menlo Park, CA (US); Chaofeng Huang, San Jose, CA (US)

(73) Assignee: T-Ram, Inc., San Jose, CA (US)

( * ) Notice: Subject to any disclaimer, the term of this patent is extended or adjusted under 35 U.S.C. 154(b) by 0 days.

(21) Appl. No.: 10/808,148

(22) Filed: Mar. 24, 2004

Related U.S. Application Data

(63) Continuation of application No. 10/396,884, filed on Mar. 25, 2003, now Pat. No. 6,734,815.

(51) Int. Cl.[7] ................................. H03M 1/66
(52) U.S. Cl. .................. 341/144; 341/120; 341/145
(58) Field of Search ................... 341/144, 120, 341/139, 145, 159; 365/185.18

(56) References Cited

U.S. PATENT DOCUMENTS

| | | | |
|---|---|---|---|
| 5,621,685 A | 4/1997 | Cernea et al. | |
| 5,703,588 A | 12/1997 | Rivoir et al. | |
| 5,949,362 A | 9/1999 | Tesch et al. | |
| 5,977,899 A | 11/1999 | Adams | |
| 6,154,160 A | 11/2000 | Meyer et al. | |
| 6,476,748 B1 | 11/2002 | Galton | |
| 6,489,905 B1 | 12/2002 | Lee et al. | |
| 6,507,296 B1 | 1/2003 | Lee et al. | |

*Primary Examiner*—Jean Bruner Jeanglaude

(57) ABSTRACT

A geometric DAC architecture includes a series of substantially identical sub-DACs, each sub-DAC having n taps. The sub-DACs are fed from a bias-DAC having m=(total number of taps needed)/n taps. The output of each of the m taps is increased geometrically at a rate of $k^n$. The geometric DAC architecture control lines desirably require only (m+n) taps compared with (m×n) taps for the simpler more conventional approach. Further, the geometric DAC architecture requires less real estate than the simpler more conventional approach, is easy to expand because it is modular, and generates an output current that is always monotonic, regardless of errors in transistor sizes and PVT variations. The n tap control lines are coded by alternately inverting n control line inputs between sub-DACs such that any state transition associated with the geometric DAC occurs with only one bit change in each of the control lines.

13 Claims, 6 Drawing Sheets

| Code # | Qh<11:0> 11 | 10 | 9 | 8 | 7 | 6 | 5 | 4 | 3 | 2 | 1 | 0 | Qi<9:0> 9 | 8 | 7 | 6 | 5 | 4 | 3 | 2 | 1 | 0 | Current ((Iout-Imin)/Ibg) | Total Current (Iout/Imin) |
|---|---|---|---|---|---|---|---|---|---|---|---|---|---|---|---|---|---|---|---|---|---|---|---|---|
| 0  | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |
| 1  | 0 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1.01 |
| 2  | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 2.01 | 1.0201 |
| 3  | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 3.0301 | 1.030301 |
| 4  | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 4.060401 | 1.04060401 |
| 5  | 0 | 0 | 0 | 0 | 0 | 0 | 0 | 0 | 0 | 0 | 0 | 0 | 0 | 0 | 0 | 0 | 0 | 1 | 1 | 1 | 1 | 1 | 5.10100501 | 1.05101005 |
| 6  | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 6.15201506 | 1.06152015 |
| 7  | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 7.21353521 | 1.072135352 |
| 8  | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 8.28567056 | 1.082856706 |
| 9  | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 9.36852727 | 1.093685273 |
| 10 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 10.46 | 1.1046 |
| 11 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 11.56462213 | 1.115646221 |
| 12 | 0 | 0 | 0 | 0 | 0 | 0 | 0 | 0 | 0 | 0 | 1 | 1 | 1 | 1 | 1 | 1 | 1 | 1 | 1 | 1 | 1 | 0 | 12.68029047 | 1.126802905 |
| 13 | 0 | 0 | 0 | 0 | 0 | 0 | 0 | 0 | 0 | 1 | 1 | 1 | 1 | 1 | 1 | 1 | 1 | 1 | 1 | 1 | 0 | 0 | 13.8071155 | 1.138071155 |
| 14 | 0 | 0 | 0 | 0 | 0 | 0 | 0 | 0 | 1 | 1 | 1 | 1 | 1 | 1 | 1 | 1 | 1 | 1 | 1 | 0 | 0 | 0 | 14.94520878 | 1.149452088 |
| 15 | 0 | 0 | 0 | 0 | 0 | 0 | 0 | 1 | 1 | 1 | 1 | 1 | 1 | 1 | 1 | 1 | 1 | 1 | 0 | 0 | 0 | 0 | 16.094683 | 1.16094683 |
| 16 | 0 | 0 | 0 | 0 | 0 | 0 | 1 | 1 | 1 | 1 | 1 | 1 | 1 | 1 | 1 | 1 | 1 | 0 | 0 | 0 | 0 | 0 | 17.25565195 | 1.172556520 |
| 17 | 0 | 0 | 0 | 0 | 0 | 1 | 1 | 1 | 1 | 1 | 1 | 1 | 1 | 1 | 1 | 1 | 0 | 0 | 0 | 0 | 0 | 0 | 18.42823060 | 1.184282306 |
| 18 | 0 | 0 | 0 | 0 | 1 | 1 | 1 | 1 | 1 | 1 | 1 | 1 | 1 | 1 | 1 | 0 | 0 | 0 | 0 | 0 | 0 | 0 | 19.61253503 | 1.196125354 |
| 19 | 0 | 0 | 0 | 1 | 1 | 1 | 1 | 1 | 1 | 1 | 1 | 1 | 1 | 1 | 0 | 0 | 0 | 0 | 0 | 0 | 0 | 0 | 20.80866825 | 1.208086825 |
| 20 | 0 | 0 | 1 | 1 | 1 | 1 | 1 | 1 | 1 | 1 | 1 | 1 | 1 | 0 | 0 | 0 | 0 | 0 | 0 | 0 | 0 | 0 | 22.02 | 1.2202 |
| 21 | 0 | 1 | 1 | 1 | 1 | 1 | 1 | 1 | 1 | 1 | 1 | 1 | 0 | 0 | 0 | 0 | 0 | 0 | 0 | 0 | 0 | 1 | 23.24019004 | 1.2324019 |
| 22 | 1 | 1 | 1 | 1 | 1 | 1 | 1 | 1 | 1 | 1 | 1 | 0 | 0 | 0 | 0 | 0 | 0 | 0 | 0 | 0 | 1 | 1 | 24.47258198 | 1.244725819 |
| 23 | 1 | 1 | 1 | 1 | 1 | 1 | 1 | 1 | 1 | 1 | 0 | 0 | 0 | 0 | 0 | 0 | 0 | 0 | 0 | 1 | 1 | 1 | 25.71729784 | 1.257172978 |
| 24 | 1 | 1 | 1 | 1 | 1 | 1 | 1 | 1 | 1 | 0 | 0 | 0 | 0 | 0 | 0 | 0 | 0 | 0 | 1 | 1 | 1 | 1 | 26.97446086 | 1.269744609 |
| 25 | 1 | 1 | 1 | 1 | 1 | 1 | 1 | 1 | 0 | 0 | 0 | 0 | 0 | 0 | 0 | 0 | 0 | 1 | 1 | 1 | 1 | 1 | 28.24419551 | 1.282441955 |
| 26 | 1 | 1 | 1 | 1 | 1 | 1 | 1 | 0 | 0 | 0 | 0 | 0 | 0 | 0 | 0 | 0 | 1 | 1 | 1 | 1 | 1 | 1 | 29.52662750 | 1.295266275 |
| 27 | 1 | 1 | 1 | 1 | 1 | 1 | 0 | 0 | 0 | 0 | 0 | 0 | 0 | 0 | 0 | 1 | 1 | 1 | 1 | 1 | 1 | 1 | 30.82188382 | 1.308218838 |
| 28 | 1 | 1 | 1 | 1 | 1 | 0 | 0 | 0 | 0 | 0 | 0 | 0 | 0 | 0 | 1 | 1 | 1 | 1 | 1 | 1 | 1 | 1 | 32.13009270 | 1.321300927 |
| 29 | 1 | 1 | 1 | 1 | 0 | 0 | 0 | 0 | 0 | 0 | 0 | 0 | 0 | 1 | 1 | 1 | 1 | 1 | 1 | 1 | 1 | 1 | 33.45138366 | 1.334513837 |
| 30 | 1 | 1 | 1 | 0 | 0 | 0 | 0 | 0 | 0 | 0 | 0 | 0 | 1 | 1 | 1 | 1 | 1 | 1 | 1 | 1 | 1 | 1 | 34.78 | 1.3478 |
| 31 | 1 | 1 | 0 | 0 | 0 | 0 | 0 | 0 | 0 | 0 | 0 | 1 | 1 | 1 | 1 | 1 | 1 | 1 | 1 | 1 | 1 | 1 | 36.12784892 | 1.361278489 |
| 32 | 1 | 0 | 0 | 0 | 0 | 0 | 0 | 0 | 0 | 0 | 1 | 1 | 1 | 1 | 1 | 1 | 1 | 1 | 1 | 1 | 1 | 0 | 37.48917632 | 1.374891763 |
| 33 | 0 | 0 | 0 | 0 | 0 | 0 | 0 | 0 | 0 | 1 | 1 | 1 | 1 | 1 | 1 | 1 | 1 | 1 | 1 | 1 | 0 | 0 | 38.864117 | 1.38864117 |
| 34 | 0 | 0 | 0 | 0 | 0 | 0 | 0 | 0 | 1 | 1 | 1 | 1 | 1 | 1 | 1 | 1 | 1 | 1 | 1 | 0 | 0 | 0 | 40.25280708 | 1.402528071 |
| 35 | 0 | 0 | 0 | 0 | 0 | 0 | 0 | 1 | 1 | 1 | 1 | 1 | 1 | 1 | 1 | 1 | 1 | 1 | 0 | 0 | 0 | 0 | 41.65538407 | 1.416553841 |
| 36 | 0 | 0 | 0 | 0 | 0 | 0 | 1 | 1 | 1 | 1 | 1 | 1 | 1 | 1 | 1 | 1 | 1 | 0 | 0 | 0 | 0 | 0 | 43.07198683 | 1.430719868 |
| 37 | 0 | 0 | 0 | 0 | 0 | 1 | 1 | 1 | 1 | 1 | 1 | 1 | 1 | 1 | 1 | 1 | 0 | 0 | 0 | 0 | 0 | 0 | 44.50275561 | 1.445027556 |
| 38 | 0 | 0 | 0 | 0 | 1 | 1 | 1 | 1 | 1 | 1 | 1 | 1 | 1 | 1 | 1 | 0 | 0 | 0 | 0 | 0 | 0 | 0 | 45.94783208 | 1.459478321 |
| 39 | 0 | 0 | 0 | 1 | 1 | 1 | 1 | 1 | 1 | 1 | 1 | 1 | 1 | 1 | 0 | 0 | 0 | 0 | 0 | 0 | 0 | 0 | 47.40735932 | 1.474073593 |

Fig. 3A

| Code # | Qh<11:0> | | | | | | | | | | | | Ql<9:0> | | | | | | | | | | Current ((Iout-Imin)/Ibg) | Total Current (Iout/Imin) |
|---|---|---|---|---|---|---|---|---|---|---|---|---|---|---|---|---|---|---|---|---|---|---|---|---|
| | 11 | 10 | 9 | 8 | 7 | 6 | 5 | 4 | 3 | 2 | 1 | 0 | 9 | 8 | 7 | 6 | 5 | 4 | 3 | 2 | 1 | 0 | | |
| 40 | 0 | 0 | 0 | 0 | 0 | 0 | 0 | 0 | 1 | 1 | 1 | 0 | 0 | 0 | 0 | 0 | 0 | 0 | 0 | 0 | 0 | 0 | 48.89 | 1.4889 |
| 41 | 0 | 0 | 0 | 0 | 0 | 0 | 0 | 0 | 1 | 1 | 1 | 1 | 0 | 0 | 0 | 0 | 0 | 0 | 0 | 0 | 0 | 1 | 50.37886373 | 1.503788637 |
| 42 | 0 | 0 | 0 | 0 | 0 | 0 | 0 | 0 | 1 | 1 | 1 | 1 | 0 | 0 | 0 | 0 | 0 | 0 | 0 | 0 | 1 | 1 | 51.8826161 | 1.518826161 |
| 43 | 0 | 0 | 0 | 0 | 0 | 0 | 0 | 0 | 1 | 1 | 1 | 1 | 0 | 0 | 0 | 0 | 0 | 0 | 0 | 1 | 1 | 1 | 53.401406 | 1.53401406 |
| 44 | 0 | 0 | 0 | 0 | 0 | 0 | 0 | 0 | 1 | 1 | 1 | 1 | 0 | 0 | 0 | 0 | 0 | 0 | 1 | 1 | 1 | 1 | 54.93538379 | 1.549353838 |
| 45 | 0 | 0 | 0 | 0 | 0 | 0 | 0 | 0 | 1 | 1 | 1 | 1 | 0 | 0 | 0 | 0 | 0 | 1 | 1 | 1 | 1 | 1 | 56.48470136 | 1.564847014 |
| 46 | 0 | 0 | 0 | 0 | 0 | 0 | 0 | 0 | 1 | 1 | 1 | 1 | 0 | 0 | 0 | 0 | 1 | 1 | 1 | 1 | 1 | 1 | 58.04951211 | 1.580495121 |
| 47 | 0 | 0 | 0 | 0 | 0 | 0 | 0 | 0 | 1 | 1 | 1 | 1 | 0 | 0 | 0 | 1 | 1 | 1 | 1 | 1 | 1 | 1 | 59.62997097 | 1.596299971 |
| 48 | 0 | 0 | 0 | 0 | 0 | 0 | 0 | 0 | 1 | 1 | 1 | 1 | 0 | 0 | 1 | 1 | 1 | 1 | 1 | 1 | 1 | 1 | 61.22623441 | 1.612262344 |
| 49 | 0 | 0 | 0 | 0 | 0 | 0 | 0 | 0 | 1 | 1 | 1 | 1 | 0 | 1 | 1 | 1 | 1 | 1 | 1 | 1 | 1 | 1 | 62.83846049 | 1.628384605 |
| 50 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 64.46 | 1.6446 |
| 51 | 0 | 0 | 0 | 0 | 0 | 0 | 0 | 1 | 1 | 1 | 1 | 1 | 1 | 1 | 1 | 1 | 1 | 1 | 1 | 1 | 1 | 0 | 66.10463182 | 1.661046318 |
| 52 | 0 | 0 | 0 | 0 | 0 | 0 | 0 | 1 | 1 | 1 | 1 | 1 | 1 | 1 | 1 | 1 | 1 | 1 | 1 | 1 | 0 | 0 | 67.76570996 | 1.6776571 |
| 53 | 0 | 0 | 0 | 0 | 0 | 0 | 0 | 1 | 1 | 1 | 1 | 1 | 1 | 1 | 1 | 1 | 1 | 1 | 1 | 0 | 0 | 0 | 69.44339888 | 1.694433989 |
| 54 | 0 | 0 | 0 | 0 | 0 | 0 | 0 | 1 | 1 | 1 | 1 | 1 | 1 | 1 | 1 | 1 | 1 | 1 | 0 | 0 | 0 | 0 | 71.13786469 | 1.711378647 |
| 55 | 0 | 0 | 0 | 0 | 0 | 0 | 0 | 1 | 1 | 1 | 1 | 1 | 1 | 1 | 1 | 1 | 1 | 0 | 0 | 0 | 0 | 0 | 72.84927516 | 1.728492752 |
| 56 | 0 | 0 | 0 | 0 | 0 | 0 | 0 | 1 | 1 | 1 | 1 | 1 | 1 | 1 | 1 | 1 | 0 | 0 | 0 | 0 | 0 | 0 | 74.57777974 | 1.745777797 |
| 57 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 76.32360956 | 1.763236096 |
| 58 | 0 | 0 | 0 | 0 | 0 | 0 | 0 | 1 | 1 | 1 | 1 | 1 | 1 | 1 | 0 | 0 | 0 | 0 | 0 | 0 | 0 | 0 | 78.08687747 | 1.780868775 |
| 59 | 0 | 0 | 0 | 0 | 0 | 0 | 0 | 1 | 1 | 1 | 1 | 1 | 1 | 0 | 0 | 0 | 0 | 0 | 0 | 0 | 0 | 0 | 79.86777807 | 1.798677781 |
| 60 | 0 | 0 | 0 | 0 | 0 | 0 | 0 | 1 | 1 | 1 | 1 | 1 | 0 | 0 | 0 | 0 | 0 | 0 | 0 | 0 | 0 | 0 | 81.67 | 1.8167 |
| 61 | 0 | 0 | 0 | 0 | 0 | 0 | 1 | 1 | 1 | 1 | 1 | 1 | 0 | 0 | 0 | 0 | 0 | 0 | 0 | 0 | 0 | 1 | 83.4866967 | 1.834866967 |
| 62 | 0 | 0 | 0 | 0 | 0 | 0 | 1 | 1 | 1 | 1 | 1 | 1 | 0 | 0 | 0 | 0 | 0 | 0 | 0 | 0 | 1 | 1 | 85.32156036 | 1.853215504 |
| 63 | 0 | 0 | 0 | 0 | 0 | 0 | 1 | 1 | 1 | 1 | 1 | 1 | 0 | 0 | 0 | 0 | 0 | 0 | 0 | 1 | 1 | 1 | 87.17477267 | 1.871747727 |
| 64 | 0 | 0 | 0 | 0 | 0 | 0 | 1 | 1 | 1 | 1 | 1 | 1 | 0 | 0 | 0 | 0 | 0 | 0 | 1 | 1 | 1 | 1 | 89.04651709 | 1.890465171 |
| 65 | 0 | 0 | 0 | 0 | 0 | 0 | 1 | 1 | 1 | 1 | 1 | 1 | 0 | 0 | 0 | 0 | 0 | 1 | 1 | 1 | 1 | 1 | 90.93697896 | 1.90936979 |
| 66 | 0 | 0 | 0 | 0 | 0 | 0 | 1 | 1 | 1 | 1 | 1 | 1 | 0 | 0 | 0 | 0 | 1 | 1 | 1 | 1 | 1 | 1 | 92.84634545 | 1.928463454 |
| 67 | 0 | 0 | 0 | 0 | 0 | 0 | 1 | 1 | 1 | 1 | 1 | 1 | 0 | 0 | 0 | 1 | 1 | 1 | 1 | 1 | 1 | 1 | 94.7748056 | 1.947748056 |
| 68 | 0 | 0 | 0 | 0 | 0 | 0 | 1 | 1 | 1 | 1 | 1 | 1 | 0 | 0 | 1 | 1 | 1 | 1 | 1 | 1 | 1 | 1 | 96.72255036 | 1.967225504 |
| 69 | 0 | 0 | 0 | 0 | 0 | 0 | 1 | 1 | 1 | 1 | 1 | 1 | 0 | 1 | 1 | 1 | 1 | 1 | 1 | 1 | 1 | 1 | 98.68977256 | 1.986897726 |
| 70 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 100.68 | 2.0068 |
| 71 | 0 | 0 | 0 | 0 | 0 | 1 | 1 | 1 | 1 | 1 | 1 | 1 | 1 | 1 | 1 | 1 | 1 | 1 | 1 | 1 | 1 | 0 | 102.6687634 | 2.026687634 |
| 72 | 0 | 0 | 0 | 0 | 0 | 1 | 1 | 1 | 1 | 1 | 1 | 1 | 1 | 1 | 1 | 1 | 1 | 1 | 1 | 1 | 0 | 0 | 104.7135944 | 2.047135944 |
| 73 | 0 | 0 | 0 | 0 | 0 | 1 | 1 | 1 | 1 | 1 | 1 | 1 | 1 | 1 | 1 | 1 | 1 | 1 | 1 | 0 | 0 | 0 | 106.7606937 | 2.067606937 |
| 74 | 0 | 0 | 0 | 0 | 0 | 1 | 1 | 1 | 1 | 1 | 1 | 1 | 1 | 1 | 1 | 1 | 1 | 1 | 0 | 0 | 0 | 0 | 108.828264 | 2.08828264 |
| 75 | 0 | 0 | 0 | 0 | 0 | 1 | 1 | 1 | 1 | 1 | 1 | 1 | 1 | 1 | 1 | 1 | 1 | 0 | 0 | 0 | 0 | 0 | 110.91651 | 2.1091651 |
| 76 | 0 | 0 | 0 | 0 | 0 | 1 | 1 | 1 | 1 | 1 | 1 | 1 | 1 | 1 | 1 | 1 | 0 | 0 | 0 | 0 | 0 | 0 | 113.0256385 | 2.130256385 |
| 77 | 0 | 0 | 0 | 0 | 0 | 1 | 1 | 1 | 1 | 1 | 1 | 1 | 1 | 1 | 1 | 0 | 0 | 0 | 0 | 0 | 0 | 0 | 115.1558582 | 2.151558582 |
| 78 | 0 | 0 | 0 | 0 | 0 | 1 | 1 | 1 | 1 | 1 | 1 | 1 | 1 | 1 | 0 | 0 | 0 | 0 | 0 | 0 | 0 | 0 | 117.3073802 | 2.173073802 |
| 79 | 0 | 0 | 0 | 0 | 0 | 1 | 1 | 1 | 1 | 1 | 1 | 1 | 1 | 0 | 0 | 0 | 0 | 0 | 0 | 0 | 0 | 0 | 119.4804173 | 2.194804173 |

Fig. 3B

| Code # | Qh<11:0> | | | | | | | | | | | | Ql<9:0> | | | | | | | | | | Current ((Iout-Imin)/Ibg) | Total Current (Iout/Imin) |
|---|---|---|---|---|---|---|---|---|---|---|---|---|---|---|---|---|---|---|---|---|---|---|---|---|
| | 11 | 10 | 9 | 8 | 7 | 6 | 5 | 4 | 3 | 2 | 1 | 0 | 9 | 8 | 7 | 6 | 5 | 4 | 3 | 2 | 1 | 0 | | |
| 80 | 0 | 0 | 0 | 0 | 1 | 1 | 1 | 1 | 1 | 1 | 1 | 1 | 0 | 0 | 0 | 0 | 0 | 0 | 0 | 0 | 0 | 0 | | 2.2167 |
| 81 | 0 | 0 | 0 | 0 | 1 | 1 | 1 | 1 | 1 | 1 | 1 | 1 | 0 | 0 | 0 | 0 | 0 | 0 | 0 | 0 | 0 | 1 | 121.67 | 2.238867152 |
| 82 | 0 | 0 | 0 | 0 | 1 | 1 | 1 | 1 | 1 | 1 | 1 | 1 | 0 | 0 | 0 | 0 | 0 | 0 | 0 | 0 | 1 | 0 | 123.8867152 | 2.261255976 |
| 83 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 126.1255976 | 2.283866688 |
| 84 | 0 | 0 | 0 | 0 | 1 | 1 | 1 | 1 | 1 | 1 | 1 | 1 | 0 | 0 | 0 | 0 | 0 | 0 | 0 | 1 | 0 | 0 | 128.3866688 | 2.306707527 |
| 85 | 0 | 0 | 0 | 0 | 1 | 1 | 1 | 1 | 1 | 1 | 1 | 1 | 0 | 0 | 0 | 0 | 0 | 0 | 0 | 1 | 0 | 1 | 130.6707527 | 2.329774754 |
| 86 | 0 | 0 | 0 | 0 | 1 | 1 | 1 | 1 | 1 | 1 | 1 | 1 | 0 | 0 | 0 | 0 | 0 | 0 | 0 | 1 | 1 | 0 | 132.9774754 | 2.353072654 |
| 87 | 0 | 0 | 0 | 0 | 1 | 1 | 1 | 1 | 1 | 1 | 1 | 1 | 0 | 0 | 0 | 0 | 0 | 0 | 0 | 1 | 1 | 1 | 135.3072654 | 2.376603533 |
| 88 | 0 | 0 | 0 | 0 | 1 | 1 | 1 | 1 | 1 | 1 | 1 | 1 | 0 | 0 | 0 | 0 | 0 | 0 | 1 | 0 | 0 | 0 | 137.6603533 | 2.400369972 |
| 89 | 0 | 0 | 0 | 0 | 1 | 1 | 1 | 1 | 1 | 1 | 1 | 1 | 0 | 0 | 0 | 0 | 0 | 0 | 1 | 0 | 0 | 1 | 140.036972 | 2.42437357 |
| 90 | 0 | 0 | 0 | 0 | 1 | 1 | 1 | 1 | 1 | 1 | 1 | 1 | 0 | 0 | 0 | 0 | 0 | 0 | 1 | 0 | 1 | 0 | 142.437357 | 2.4486 |
| 91 | 0 | 0 | 0 | 0 | 1 | 1 | 1 | 1 | 1 | 1 | 1 | 1 | 1 | 1 | 1 | 1 | 1 | 1 | 0 | 1 | 1 | 1 | 144.86 | 2.473086327 |
| 92 | 0 | 0 | 0 | 0 | 1 | 1 | 1 | 1 | 1 | 1 | 1 | 1 | 1 | 1 | 1 | 1 | 1 | 1 | 1 | 0 | 0 | 0 | 147.3086327 | 2.497817517 |
| 93 | 0 | 0 | 0 | 0 | 1 | 1 | 1 | 1 | 1 | 1 | 1 | 1 | 1 | 1 | 1 | 1 | 1 | 1 | 1 | 0 | 0 | 1 | 149.7817517 | 2.522796019 |
| 94 | 0 | 0 | 0 | 0 | 1 | 1 | 1 | 1 | 1 | 1 | 1 | 1 | 1 | 1 | 1 | 1 | 1 | 1 | 1 | 0 | 1 | 0 | 152.2796019 | 2.548024306 |
| 95 | 0 | 0 | 0 | 0 | 1 | 1 | 1 | 1 | 1 | 1 | 1 | 1 | 1 | 1 | 1 | 1 | 1 | 1 | 1 | 0 | 1 | 1 | 154.8024306 | 2.573504875 |
| 96 | 0 | 0 | 0 | 0 | 1 | 1 | 1 | 1 | 1 | 1 | 1 | 1 | 1 | 1 | 1 | 1 | 1 | 1 | 1 | 1 | 0 | 0 | 157.3504875 | 2.599240251 |
| 97 | 0 | 0 | 0 | 0 | 1 | 1 | 1 | 1 | 1 | 1 | 1 | 1 | 1 | 1 | 1 | 1 | 1 | 1 | 1 | 1 | 0 | 1 | 159.9240251 | 2.625232998 |
| 98 | 0 | 0 | 0 | 0 | 1 | 1 | 1 | 1 | 1 | 1 | 1 | 1 | 1 | 1 | 1 | 1 | 1 | 1 | 1 | 1 | 1 | 0 | 162.523298 | 2.651485637 |
| 99 | 0 | 0 | 0 | 0 | 1 | 1 | 1 | 1 | 1 | 1 | 1 | 1 | 1 | 1 | 1 | 1 | 1 | 1 | 1 | 1 | 1 | 1 | 165.1485637 | 2.67800082 |
| 100 | 0 | 0 | 0 | 1 | 1 | 1 | 1 | 1 | 1 | 1 | 1 | 1 | 0 | 0 | 0 | 0 | 0 | 0 | 0 | 0 | 0 | 0 | 167.800082 | 2.7048 |
| 101 | 0 | 0 | 0 | 1 | 1 | 1 | 1 | 1 | 1 | 1 | 1 | 1 | 0 | 0 | 0 | 0 | 0 | 0 | 0 | 0 | 0 | 1 | 170.48 | 2.731848138 |
| 102 | 0 | 0 | 0 | 1 | 1 | 1 | 1 | 1 | 1 | 1 | 1 | 1 | 0 | 0 | 0 | 0 | 0 | 0 | 0 | 0 | 1 | 0 | 173.1848138 | 2.759166758 |
| 103 | 0 | 0 | 0 | 1 | 1 | 1 | 1 | 1 | 1 | 1 | 1 | 1 | 0 | 0 | 0 | 0 | 0 | 0 | 0 | 0 | 1 | 1 | 175.9166758 | 2.786758564 |
| 104 | 0 | 0 | 0 | 1 | 1 | 1 | 1 | 1 | 1 | 1 | 1 | 1 | 0 | 0 | 0 | 0 | 0 | 0 | 0 | 1 | 0 | 0 | 178.6758564 | 2.814626288 |
| 105 | 0 | 0 | 0 | 1 | 1 | 1 | 1 | 1 | 1 | 1 | 1 | 1 | 0 | 0 | 0 | 0 | 0 | 0 | 0 | 1 | 0 | 1 | 181.4626288 | 2.842772689 |
| 106 | 0 | 0 | 0 | 1 | 1 | 1 | 1 | 1 | 1 | 1 | 1 | 1 | 0 | 0 | 0 | 0 | 0 | 0 | 0 | 1 | 1 | 0 | 184.2772689 | 2.871200554 |
| 107 | 0 | 0 | 0 | 1 | 1 | 1 | 1 | 1 | 1 | 1 | 1 | 1 | 0 | 0 | 0 | 0 | 0 | 0 | 0 | 1 | 1 | 1 | 187.1200554 | 2.899912698 |
| 108 | 0 | 0 | 0 | 1 | 1 | 1 | 1 | 1 | 1 | 1 | 1 | 1 | 0 | 0 | 0 | 0 | 0 | 0 | 1 | 0 | 0 | 0 | 189.9912698 | 2.928911963 |
| 109 | 0 | 0 | 0 | 1 | 1 | 1 | 1 | 1 | 1 | 1 | 1 | 1 | 0 | 0 | 0 | 0 | 0 | 0 | 1 | 0 | 0 | 1 | 192.8911963 | 2.958201221 |
| 110 | 0 | 0 | 0 | 1 | 1 | 1 | 1 | 1 | 1 | 1 | 1 | 1 | 0 | 0 | 0 | 0 | 0 | 0 | 1 | 0 | 1 | 0 | 195.8201221 | 2.9878 |
| 111 | 0 | 0 | 0 | 1 | 1 | 1 | 1 | 1 | 1 | 1 | 1 | 1 | 1 | 1 | 1 | 1 | 1 | 1 | 0 | 1 | 1 | 1 | 198.78 | 3.017677972 |
| 112 | 0 | 0 | 0 | 1 | 1 | 1 | 1 | 1 | 1 | 1 | 1 | 1 | 1 | 1 | 1 | 1 | 1 | 1 | 1 | 0 | 0 | 0 | 201.7677972 | 3.047854724 |
| 113 | 0 | 0 | 0 | 1 | 1 | 1 | 1 | 1 | 1 | 1 | 1 | 1 | 1 | 1 | 1 | 1 | 1 | 1 | 1 | 0 | 0 | 1 | 204.7854724 | 3.078333243 |
| 114 | 0 | 0 | 0 | 1 | 1 | 1 | 1 | 1 | 1 | 1 | 1 | 1 | 1 | 1 | 1 | 1 | 1 | 1 | 1 | 0 | 1 | 0 | 207.8333243 | 3.109116547 |
| 115 | 0 | 0 | 0 | 1 | 1 | 1 | 1 | 1 | 1 | 1 | 1 | 1 | 1 | 1 | 1 | 1 | 1 | 1 | 1 | 0 | 1 | 1 | 210.9116547 | 3.140207685 |
| 116 | 0 | 0 | 0 | 1 | 1 | 1 | 1 | 1 | 1 | 1 | 1 | 1 | 1 | 1 | 1 | 1 | 1 | 1 | 1 | 1 | 0 | 0 | 214.0207685 | 3.171609734 |
| 117 | 0 | 0 | 0 | 1 | 1 | 1 | 1 | 1 | 1 | 1 | 1 | 1 | 1 | 1 | 1 | 1 | 1 | 1 | 1 | 1 | 0 | 1 | 217.1609734 | 3.203325803 |
| 118 | 0 | 0 | 0 | 1 | 1 | 1 | 1 | 1 | 1 | 1 | 1 | 1 | 1 | 1 | 1 | 1 | 1 | 1 | 1 | 1 | 1 | 0 | 220.3325803 | 3.235359033 |
| 119 | 0 | 0 | 0 | 1 | 1 | 1 | 1 | 1 | 1 | 1 | 1 | 1 | 1 | 1 | 1 | 1 | 1 | 1 | 1 | 1 | 1 | 1 | 223.5359033 | 3.267712596 |
| 120 | 0 | 0 | 1 | 0 | 1 | 1 | 1 | 1 | 1 | 1 | 1 | 1 | 0 | 0 | 0 | 0 | 0 | 0 | 0 | 0 | 0 | 0 | 226.7712596 | 3.3004 |
| | | | | | | | | | | | | | | | | | | | | | | | 230.04 | |

Fig. 3C

GEOMETRIC D/A CONVERTER FOR A DELAY-LOCKED LOOP

RELATED APPLICATIONS

This is a continuation of application Ser. No. 10/396,884 filed Mar. 25, 2003 now U.S. Pat. No. 6,734,815. This application is incorporated herein by reference.

BACKGROUND OF THE INVENTION

1. Field of the Invention

This invention relates generally to digital-to-analog converters (DACs), and more particularly to a geometric D/A converter architecture that can be used to implement a delay-locked loop (DLL) with a digital control loop.

2. Description of the Prior Art

The general architecture of a DLL 100 with a digital control loop is shown in FIG. 1. The DLL 100 includes of a delay line 102 with controllable delay (shown as a chain of buffers in the Figure). The control signal 104 is analog. DLL 100 further includes a phase detector 106 (shown as pd) which compares the input and output clock signals 108, 110 of the delay line 102 and issues an appropriate signal in response to a mismatch. The DLL 100 also includes a filter and state machine 112 which receives the phase detector results and makes an appropriate decision with regard to any delay increase or decrease. Finally, DLL 100 can also be seen to include a D/A converter 120 (shown and referred to herein after as DAC), which converts the filter and state machine 112 results from digital format to analog, which are then fed to the delay line control line 104.

The cells of delay line 102 can be, for example, current starved inverters, meaning that the delay of each cell is controlled by varying the amount of current available for switching. In this implementation, the output of the DAC 120 is a current. The delay of a current starved inverter is known to be proportional to C~Vdd/I, where C is the input capacitance of the gate, Vdd is the supply voltage, and I is the current supplied to the cell.

If a linear DAC 120 is employed along with the delay line 102 to provide a 1% delay resolution, for example, the 1% delay resolution should be set at the minimum current or maximum delay. Then, if for example, a delay range of 2–4 nsec is desired and if the associated process, voltage and temperature (PVT) variations and margins are assumed to be 65%, the delay resolution will be 24–40 psec at 4 nsec (0.6%–1%) and 6–10 psec at 2 nsec (0.3%–0.5%). The foregoing characteristics necessitate at least 230 taps for the DAC 120 (number of taps=$(I_{max}/I_{min}-1)/0.01=(2\times1.65-1)/0.01=230$). Considering the unnecessary fine resolution at 2 nsec, this will of course result in wasted resources.

A better solution might be to implement a geometric DAC 120, in which the current output from tap to tap increases geometrically. In the present document, the required resolution is denoted by the term (k-1). For example a resolution of 1% means that k-=0.01 or k=1.01. Then choosing:

$I_0=I_{min}$, $i_1=I_0(k-1)$, $i_2=I_0(k-1)k, i_3=I_0(k-1)k^2$, ... $i_n=I_0(k-1)k^{-1}$ renders $I_n=I_0 k^n$, and Delay $\propto 1/(I_0 k^n)\propto(1/k^n)$ All of the delay steps will thus be k times apart from one another. The same 1% resolution discussed herein before can therefore now be achieved using only 120 taps.

Such a geometric DAC can be implemented simply by using a series of 120 consecutive geometrically sized transistors having 120 output switches. This type of implementation is problematic however, in that the size of the DAC 120 can become large; and in fact can be as large as the linear DAC discussed herein before. Since 120 control lines will be necessary, an appropriate shift register can be employed, but will also be problematic since it will be large and difficult to control.

The desired geometric DAC can also be implemented by summing the current from a pair of DACs. One DAC would be a sub-DAC with n output taps, each one providing the minimum current resolution. The primary DAC would have m output taps, with each tap providing the current resolution of n taps combined ($k^n-1$ for a geometric DAC), where m should be (total number of taps needed)/n. While this technique is easy to implement using a linear DAC, it does not render itself easily to the implementation of a geometric DAC. Considering errors in transistor sizes, this implementation can even lead to a DAC having an undesirable non-monotonic output current. Further, the overall DAC size remains undesirably the same.

It would therefore be desirable and advantageous in view of the foregoing to provide a geometric D/A architecture suitable for implementing a delay-locked loop with a digital control loop and that does not suffer the shortcomings discussed herein above.

SUMMARY OF THE INVENTION

The present invention is directed to a geometric DAC architecture. The DAC architecture includes a series of substantially identical sub-DACs, each sub-DAC having n taps. The sub-DACs are fed from a bias-DAC having m=(total number of taps needed)/n taps. The output of each of the m taps is increased geometrically at a rate of $k^n$, where k has the same meaning as the same symbol used in the background section. The geometric DAC architecture control lines desirably require only (m+n) bits compared with (m×n) bits for the simpler more conventional approach. Further, the geometric DAC architecture requires less real estate than the simpler more conventional approach, is easy to expand because it is modular, and generates an output current that is always monotonic, regardless of errors in transistor sizes and PVT variations.

According to one embodiment, a digital-to-analog converter (DAC) comprises a series of substantially identical sub-DACs, each sub-DAC having n taps and (n+m) control lines; and a bias-DAC having m output taps, wherein the output of each of the m taps is increased geometrically from its immediately preceding bias-DAC output tap, and further wherein each bias-DAC output tap is configured to bias one sub-DAC.

The DAC may also comprise means for alternately inverting n control lines between sub-DACs such that any state transition associated with the DAC occurs in response to no more than a single bit change in any of the n and m control lines.

According to another embodiment, a method of controlling a geometric DAC comprises the steps of providing a geometric DAC having a plurality of substantially identical sub-DACs, a bias-DAC, and n+m control lines, wherein n=number of sub-DAC outputs and m=number of bias-DAC outputs; coding the m control lines to control which sub-DACs are active; and coding the n control lines to control which sub-DAC taps are active in association with the last known active sub-DAC.

The method of controlling a geometric DAC may also comprise of alternately inverting n control line inputs between sub-DACs such that any state transition associated with the geometric DAC occurs with only one bit change in each of the control lines.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein:

FIGS. 3A–3C show a full code listing including the normalized current outputs for the DAC depicted in FIG. 2.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
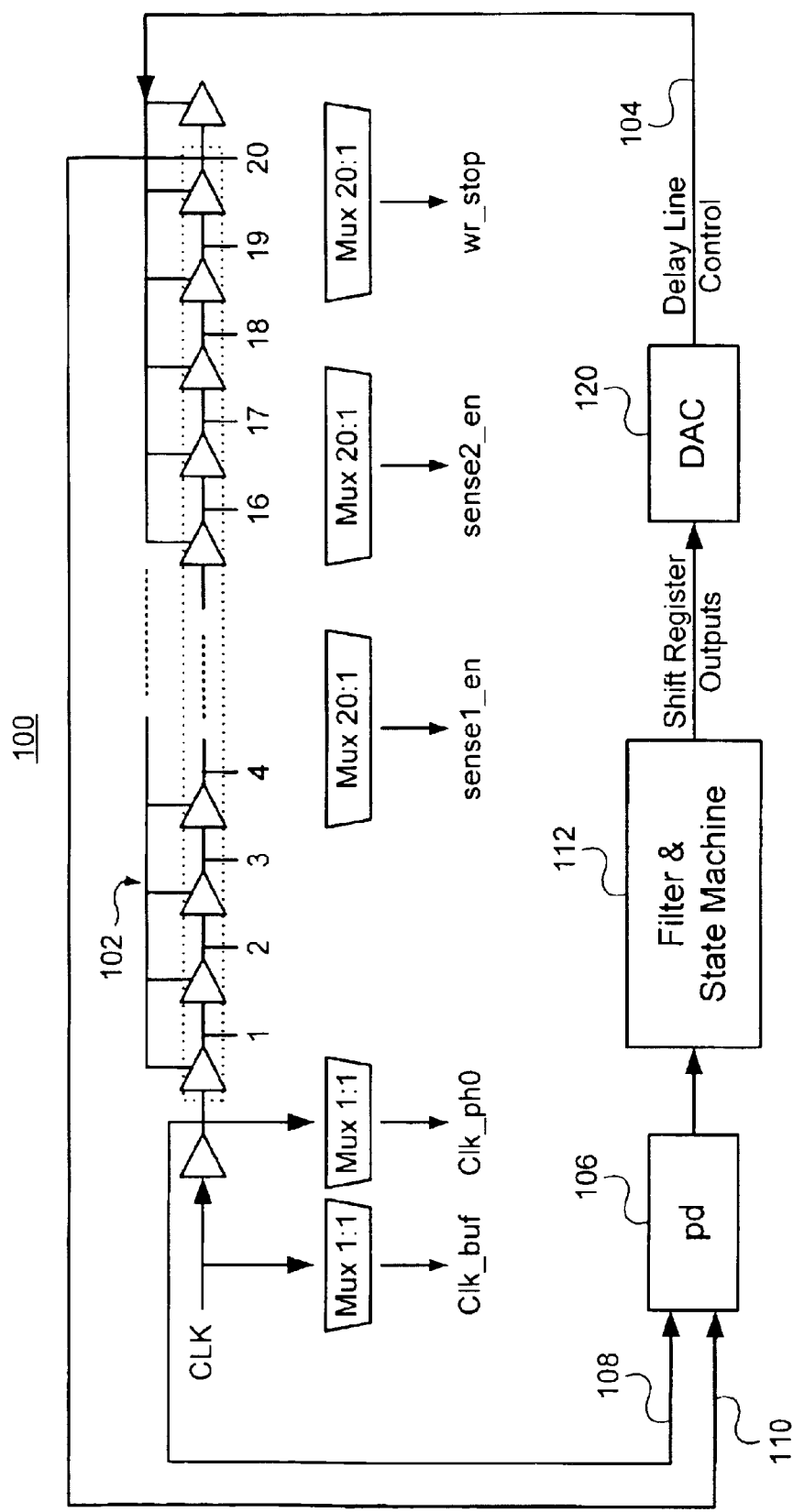
FIG. 1 illustrates the general architecture of a delay-locked loop (DLL) with a digital control loop.
Figure 2:
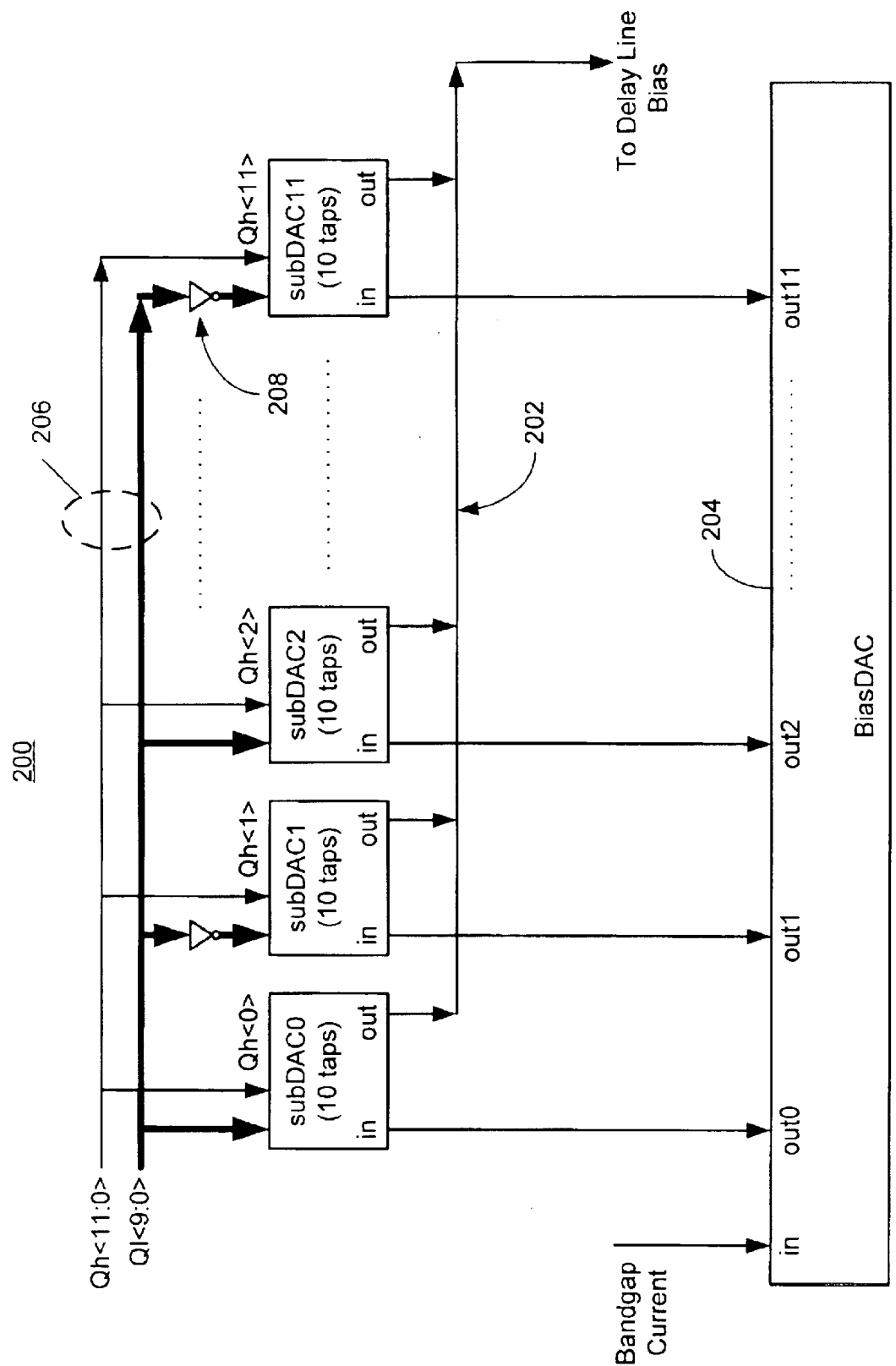
FIG. 2 is a block diagram illustrating a DAC according to one embodiment of the present invention.

FIG. 2 is a block diagram illustrating a DAC 200 according to one embodiment of the present invention. DAC 200 employs a geometric architecture. This DAC architecture includes a series of substantially identical sub-DACs 202, each sub-DAC having n taps, where n=10 for this embodiment. The sub-DACs 202 are fed from a bias-DAC 204 having m=(total number of taps needed)/n taps, where m=12 for this embodiment. The output of each of these m taps is increased geometrically at a rate of $k^n$. The outputs of these sub-DACs, either directly or transformed, are used as the control signal of a delay line. The input current to the bias-DAC 204 is a bias DC current. In the present embodiment, it comes from a bandgap bias generator. (In the illustration 200, the directions of the arrows show the directions of the current flow. For example, the arrows from bias-DAC 204 to sub-DACs 202 are shown to go from sub-DACs 202 to bias-DAC 204, although these currents are the outputs of bias-DAC 204 to sub-DAC 202.)

The control lines 206 will be only m+n bits, compared with m×n=(total number of taps needed) for the simple implementation discussed herein before using 120 consecutive geometrically sized transistors with 120 output switches. Using the exemplary numbers discussed above, the DAC architecture shown in FIG. 2 will then require only 22 bits compared to the 120 bits required by the simple implementation. It is easily appreciated this DAC architecture allows the use of simpler and smaller logic implementations.

Those familiar with the DLL art will recognize that a fast mode is generally used to in the initial cycles when starting a DLL. The DAC architecture depicted in FIG. 2 with reference to the inventive embodiments discussed herein easily allows implementation of such a fast mode. In the fast mode, the DAC 200 current resolution will be relaxed to allow for a faster approach to the requisite locking point. This is easily achieved using the DAC 200 simply by switching the higher order control bits (depicted as Qh in FIG. 2) and basically jumping from one sub-DAC to the adjacent one within the plurality of sub-DACs 202.

The present inventors found the DAC architecture illustrated in FIG. 2 to provide numerous advantages when compared with known architectures. DAC 200, for example, requires a smaller total transistor area (For the embodiment described herein, the area is only about ⅔ that required using known architectures.). Further, the DAC 200 architecture was found to be extremely modular since the sub-DACs 202 are substantially identical and can be repeated as many times as necessary. The DAC 200 architecture is therefore easily expandable. Another advantage found by the present inventors relates to the DAC 200 output current that is always monotonic, regardless of errors in transistor sizes and PVT variations.

The DAC 200 control bits 206 comprise only m+n bits, in which m is the number of sub-DACs 202 and n is the number of taps from each sub-DAC (12+10 for the embodiment described herein), as stated herein before. The Qh bits shown in FIG. 2 control which sub-DACs 202 are active. The Ql bits control which taps in the last active sub-DAC are on (all other previous sub-DACs are completely on). It can be appreciated that one way of coding the DAC 200, for example, is just to use normal control bits, out of two shift registers. An explanation of this approach is demonstrated for the following example code:

Qh<11:0>:000000000011
Ql<9:0>:00000000001

The foregoing Qh bits signify that sub-DACs 0 and 1 are totally on, and sub-DAC 2 is being controlled by the Ql bits. All other sub-DACs are off. The foregoing Ql bits signify that the first tap out of sub-DAC 2 is on.

Using this normal control bit approach will create glitches at the output of the DAC 200 for certain transitions. Using the embodiment shown in FIG. 2, for example, one transition is described as follows:

| Qh<11:0> | Ql<9:0> |
|---|---|
| 000000000011 | 0111111111 |
| ↓ | ↓ |
| 000000000111 | 0000000000 |

Since the Qh<11:0> and Ql<9:0> transitions will not occur exactly at the same time, one of the following paths will occur for the transition:

| Qh<11:0> | Ql<9:0> | |
|---|---|---|
| 000000000011 | 0111111111 | |
| ↓ | ↓ | |
| 000000000111 | 0111111111 | (Undesirable Transition State) |
| ↓ | ↓ | |
| 00000000111 | 0000000000 | |

| Qh<11:0> | Ql<9:0> | |
|---|---|---|
| 000000000011 | 0111111111 | |
| ↓ | ↓ | |
| 000000000011 | 0000000000 | (Undesirable Transition State) |
| ↓ | ↓ | |
| 00000000111 | 0000000000 | |

In either case, the DAC 200 will jump to a state where the corresponding output is off from the desirable output by $k^{n-1}$ (k=1.01, n=10 and thus $k^{n-1} \cong 9.4\%$ for the embodiment described herein). This is problematic since too many bits are transitioning for only one state transition.

The present inventors, recognizing the foregoing operational problem, implemented a method of operating the DAC 200 as now described herein below with reference to FIGS. 3A–3C. FIGS. 3A–3C, in combination, show a listing of the full code and the normalized current outputs associated with the DAC 200 shown in FIG. 2.

Looking first again at FIG. 2, the Ql<9:0> code for the sub-DACs 202 was inverted for every other sub-DAC as depicted via inverters 208. The above described transition without use of this inverting technique will now appear as described below using the inverters 208.

| Qh<11:0> | Ql<9:0> | |
|---|---|---|
| 000000000011 | 0111111111 | (Q1 controls non-inverted sub-DAC, number 2) |
| ↓ | ↓ | |
| 000000000111 | 1111111111 | (Q1 controls inverted sub-DAC, number 3) |

The state transition, as can be easily seen, now occurs with only one bit change in each of the control bits. Since the next sub-DAC (number 3) inverts the Ql bits, the 1111111111 code will be identical with the 0000000000 code associated with the previous non-inverted coding. The present inventors considered all the transition times and the dynamics of the DAC 200 and concluded that it was more appropriate for the Qh bits to transition earlier. This technique was found by the present inventors to negate glitches appearing at the output of the DAC 200. FIGS. 3A–3C illustrate the full code associated with the foregoing example described with reference to FIG. 2.

Figure 4:
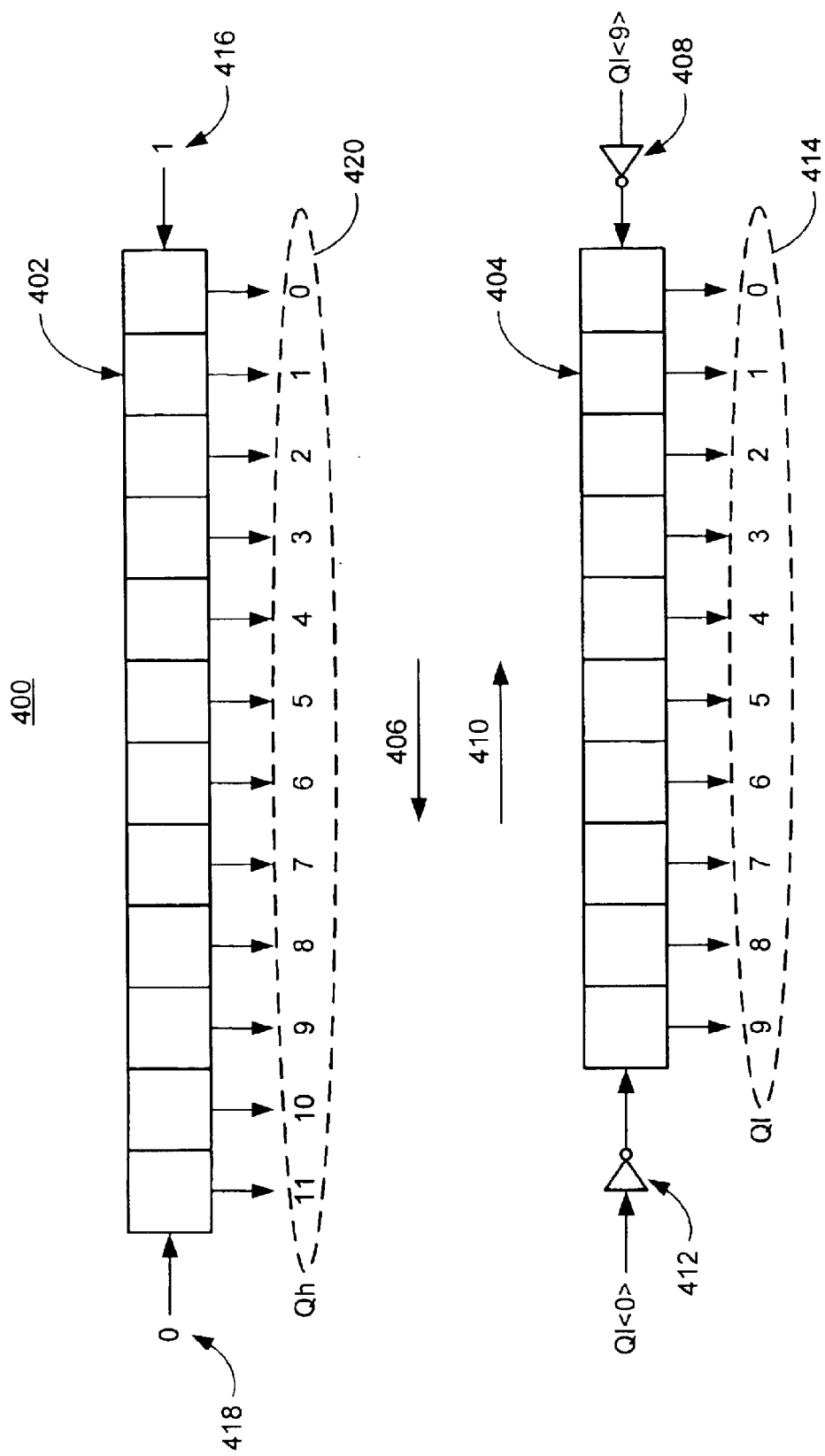
FIG. 4 is a diagram illustrating the use of shift registers to implement a coding scheme of the present invention.

The inverted coding scheme was found easy to implement using shift registers 400, shown in FIG. 4. Qh is implemented with a simple shift register 402. Regarding Ql, the shift register 404 is fed with the inverted version of the last bit.

When DAC 200 current is being increased, the bits in Ql shift register 404 are shifted in 406 direction and the shift register is fed with the inverted version of Ql<9> (due to the presence of an inverter 408). When DAC 200 current is being decreased, the bits are shifted in 410 direction and the shift register is fed with the inverted version of Ql<0> (due to the presence of an inverter 412). The output of this shift register 414 goes to the Ql bits of DAC 200.

Once Ql shift register 404 goes through one full shift, Qh shift register 402 needs to be shifted. When DAC 200 current is being increased, Qh shift happens when Ql<9> and Ql<8> are opposite of each other (ref. FIGS. 3A–3C). The bits in Qh shift register 402 are shifted in 406 direction and the shift register is fed with a value of "1" (shown as reference numeral 416). When DAC 200 current is being decreased, Qh shift happens when Ql<9> and Ql<0> are the same. The bits in Qh shift register 402 are shifted in 410 direction and the shift register is fed with a value of "0" (shown as reference numeral 418). The output of this shift register 420 goes to the Qh bits of DAC 200.

With reference to the example discussed herein before, Ql has 10 bits (Ql<9:0>). When increasing DAC 200 current, Ql<9> is inverted and fed back to the input of the shift register. Thus, after
Ql<9:0>:0111111111,
the result will be:
Ql<9:0>:1111111111
followed by:
Ql<9:0>:1111111110.
Also, after
Ql<9:0>:1000000000,
the result will be:
Ql<9:0>:0000000000
followed by:
Ql<9:0>:0000000001.

In summary, the coding for high order bits (Qh) is a regular thermometer code. For low order bits (Ql), it is either a regular thermometer code or an inverted thermometer code, depending on Qh.

In more mathematical terms, if there are m sub-DACs (m bias-DAC outputs) and n internal taps for each sub-DAC (m=12, n=10 for this example), then there are Qh<m−1:0> and Ql<n−1:0> digital values, and the total number of individual cases is (m*n). If p denotes the code number of the current output (where p=0→(m*n)), then for code p:

$Qh<i>$=1 if i<=int(p/n);

$Qh<i>$=0 if i>int(p/n);

$Ql<i>$=1−(int(p/n)mod 2) if i<(p mod n); and $Ql<i>$=(int(p/n)mod 2) if i>=(p mod n);

where int( ) denotes the integer function and mod denotes the modulo function. Note that Ql can also have the inverted form of the above equations.

In summary explanation, a geometric DAC architecture has been described that includes a series of substantially identical sub-DACs, each sub-DAC having n taps. The sub-DACs are fed from a bias-DAC has m=(total number of taps needed)/n taps. The output of each of the m taps is increased geometrically at a rate of $k^n$. The geometric DAC architecture control lines desirably require only (m+n) bits compared with (m×n) bits for the simpler more conventional approach. A control bit technique has also been described to substantially eradicate glitches at the output of the DAC 200 for certain transitions.

This invention has been described in considerable detail in order to provide those skilled in the DAC art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, while certain embodiments set forth herein illustrate various hardware implementations, the present invention shall be understood to also parallel structures and methods using software implementations as set forth in the claims.

What is claimed is:

1. An apparatus comprising:
   a delay line controllable by an analog control signal; and
   a converter for generating the analog control signal, the converter comprising:
      a bias circuit; and
      a plurality of substantially identical digital-to-analog converters each being biased by the bias circuit with a value that increases substantially geometrically from its preceding digital-to-analog converter, the analog control signal being generated using outputs of at least some of the plurality of digital-to-analog converters.

2. The apparatus of claim 1 wherein each of the plurality of digital-to-analog converters has a plurality of taps and is controlled by a first and a second type of digital control data, the first type for selecting active digital-to-analog converters and the second type for selecting at least one of the taps in at least one of the active digital-to-analog converter.

3. The apparatus of claim 2 wherein the converter further comprises at least one shift register for generating one of the first and second types of digital control data.

4. The apparatus of claim 2 wherein the converter further comprising a first and a second shift register for generating the first and the second types of digital control data, respectively.

5. The apparatus of claim 4 wherein at least one of the first and the second shift registers generates thermo coded data.

6. The apparatus of claim 4 wherein the first and the second shift registers generate thermo coded data.

7. The apparatus of claim 4 wherein one of the first and the second shift registers generates thermo coded data and the other of the first and the second shift registers generates inverted thermo coded data.

8. The apparatus of claim 2 wherein the converter further comprises a plurality of inverters configured to alternatively invert the second type of digital control signals.

9. The apparatus of claim 2 wherein the converter further comprises a plurality of inverters configured to alternatively invert at least one of the first and the second types of digital control signals.

10. The apparatus of claim 1 wherein the bias circuit generates bias currents for biasing the plurality of digital-to-analog converters.

11. The apparatus of claim 10 wherein each of the plurality of digital-to-analog converters has a plurality of taps and is controlled by a first and a second type of digital control data, the first type for selecting active digital-to-analog converters and the second type for selecting at least one of the taps in at least one of the active digital-to-analog converter.

12. The apparatus of claim 11 wherein the converter further comprises at least one shift register for generating one of the first and second types of digital control data.

13. The apparatus of claim 11 wherein the converter further comprises a plurality of inverters configured to alternatively invert at least one of the first and the second types of digital control signals.

* * * * *